United States Patent
Chen et al.

(10) Patent No.: US 8,120,052 B2
(45) Date of Patent: *Feb. 21, 2012

(54) FLIP CHIP TYPE LED LIGHTING DEVICE MANUFACTURING METHOD

(75) Inventors: Jeffrey Chen, Hsinchu (TW); Chung Zen Lin, Kaohsiung (TW)

(73) Assignee: Neobulb Technologies, Inc., Bandar Seri Begawan (BN)

( * ) Notice: Subject to any disclaimer, the term of this patent is extended or adjusted under 35 U.S.C. 154(b) by 0 days.

This patent is subject to a terminal disclaimer.

(21) Appl. No.: 12/700,853

(22) Filed: Feb. 5, 2010

(65) Prior Publication Data

US 2010/0133558 A1 Jun. 3, 2010

Related U.S. Application Data

(63) Continuation of application No. 11/896,778, filed on Sep. 6, 2007, now Pat. No. 7,795,626, which is a continuation of application No. 11/029,387, filed on Jan. 6, 2005, now Pat. No. 7,629,188.

(30) Foreign Application Priority Data

Nov. 5, 2004 (TW) ................................ 93133779 A

(51) Int. Cl.
*H01L 33/62* (2010.01)
(52) U.S. Cl. .......... 257/98; 257/675; 257/676; 257/778; 257/E33.057

(58) Field of Classification Search ............... 257/88, 257/98, 675, 676, 778, E33.057
See application file for complete search history.

(56) References Cited

U.S. PATENT DOCUMENTS

| | | | | |
|---|---|---|---|---|
| 5,482,896 A | * | 1/1996 | Tang | 438/28 |
| 5,652,461 A | * | 7/1997 | Ootsuki et al. | 257/675 |
| 6,936,855 B1 | * | 8/2005 | Harrah | 257/88 |
| 7,180,240 B2 | | 2/2007 | Noguchi et al. | |
| 7,495,322 B2 | * | 2/2009 | Hashimoto et al. | 257/676 |
| 7,646,030 B2 | * | 1/2010 | Chen et al. | 257/88 |
| 2003/0189830 A1 | * | 10/2003 | Sugimoto et al. | 362/294 |
| 2004/0004435 A1 | * | 1/2004 | Hsu | 313/512 |
| 2004/0069999 A1 | * | 4/2004 | Lin et al. | 257/88 |
| 2004/0070338 A1 | | 4/2004 | Noguchi et al. | |
| 2004/0140543 A1 | * | 7/2004 | Elpedes et al. | 257/676 |
| 2006/0012299 A1 | * | 1/2006 | Suehiro et al. | 313/512 |
| 2006/0164836 A1 | | 7/2006 | Suehiro et al. | |
| 2010/0224904 A1 | * | 9/2010 | Lee et al. | 257/99 |

FOREIGN PATENT DOCUMENTS

| | | |
|---|---|---|
| JP | 2000-006467 | 1/2000 |
| JP | 2004-128424 | 4/2004 |
| JP | 2004-228408 | 8/2004 |

* cited by examiner

*Primary Examiner* — Mary Wilczewski
*Assistant Examiner* — Toniae Thomas
(74) *Attorney, Agent, or Firm* — Rosenberg, Klein & Lee

(57) ABSTRACT

A flip chip type LED lighting device manufacturing method includes the step of providing a strip, the step of providing a submount, the step of forming a metal bonding layer on the strip or submount, the step of bonding the submount to the strip, and the step of cutting the structure thus obtained into individual flip chip type LED lighting devices.

8 Claims, 5 Drawing Sheets

FLIP CHIP TYPE LED LIGHTING DEVICE MANUFACTURING METHOD

RELATED APPLICATIONS

This application is a Continuation patent application of of pending Ser. No. 11/896,778, filed 6 Sep. 2007, currently pending, which is a Continuation patent application Ser. No. 11/029,387, filed 6 Jan. 2005, now issued as U.S. Pat. No. 7,629,188.

BACKGROUND OF THE INVENTION

1. Field of the Invention

The present invention relates to a lighting device manufacturing method and more particularly, to a simple method of making flip chip type LED lighting devices without wire bonding.

2. Description of the Related Art

A lighting device is a requisite in our daily life. It lights up the space when dark. Following fast development of high technology, flip chip LEDs have been intensively used to substitute for conventional incandescent lamps.

FIG. 1 is a schematic sectional view of a flip chip type LED lighting device made according to the prior art. According to this design, the flip chip type LED lighting device 1 comprises a submount 12, bond fingers 16, 18 provided at two sides of the submount 12, and a plurality of flip chip LEDs (light emitting diodes) 10 bonded on the submount 12 and electrically connected to the bond fingers 16, 18 by wire bonding. According to this design, a die bonding and a wire bonding procedures must be employed to have the legs of the LEDs 10 connected to the bond fingers 16, 18. This wire bonding procedure is complicated. During wire bonding, the LEDs 10 or submount 12 may be damaged accidentally.

Therefore, it is desirable to provide a flip chip type LED lighting device manufacturing method, which eliminates the aforesaid problem.

SUMMARY OF THE INVENTION

The present invention has been accomplished under the circumstances in view. It is one object of the present invention to provide a flip chip type LED lighting device manufacturing method, which eliminates the application of wire bonding. It is another object of the present invention to provide a flip chip type LED lighting device manufacturing method, which has the bottom wall of the submount exposed to the outside for the bonding of a heat conducting/dissipating member to improve the heat dissipation effect of the lighting device. To achieve these and other objects of the present invention, the flip chip type LED lighting device manufacturing method comprises the steps of a) providing a strip, the strip comprising a plurality of strip elements, the strip elements having a respective metal lead frame respectively electrically connected to one another; b) providing a submount, the submount comprising a submount and a plurality of flip chip LEDs (light emitting diodes) installed in the submount; c) forming a metal bonding layer between the strip bond pad, that has been pre-fixed in the strip, and the submount to form a lighting structure; and d) cutting the lighting structure thus obtained into individual flip chip type LED lighting devices based on each strip element. The method of the invention further comprises the step of bonding a heat conducting/dissipating member to the submount of each individual flip chip type LED lighting device.

DETAILED DESCRIPTION OF THE PREFERRED EMBODIMENT

Figure 1:
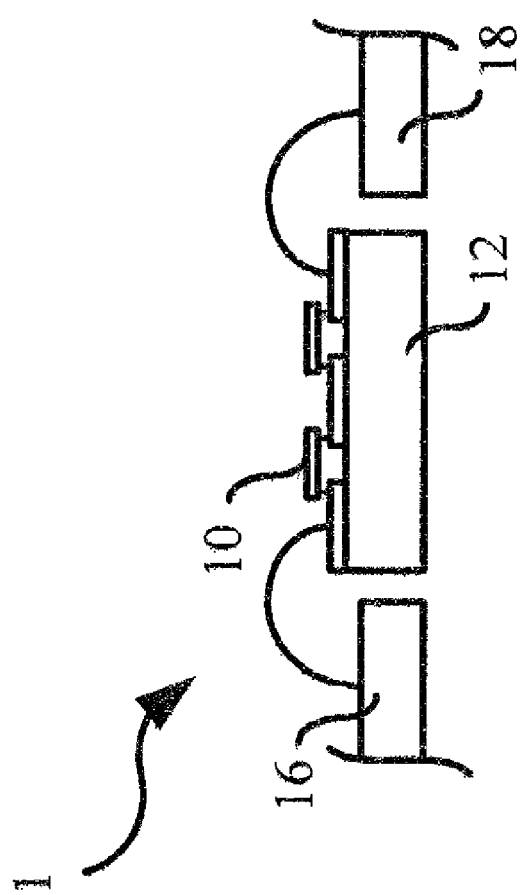
FIG. 1 is a schematic sectional view of a flip chip type LED lighting device made according to the prior art.
Figure 2:
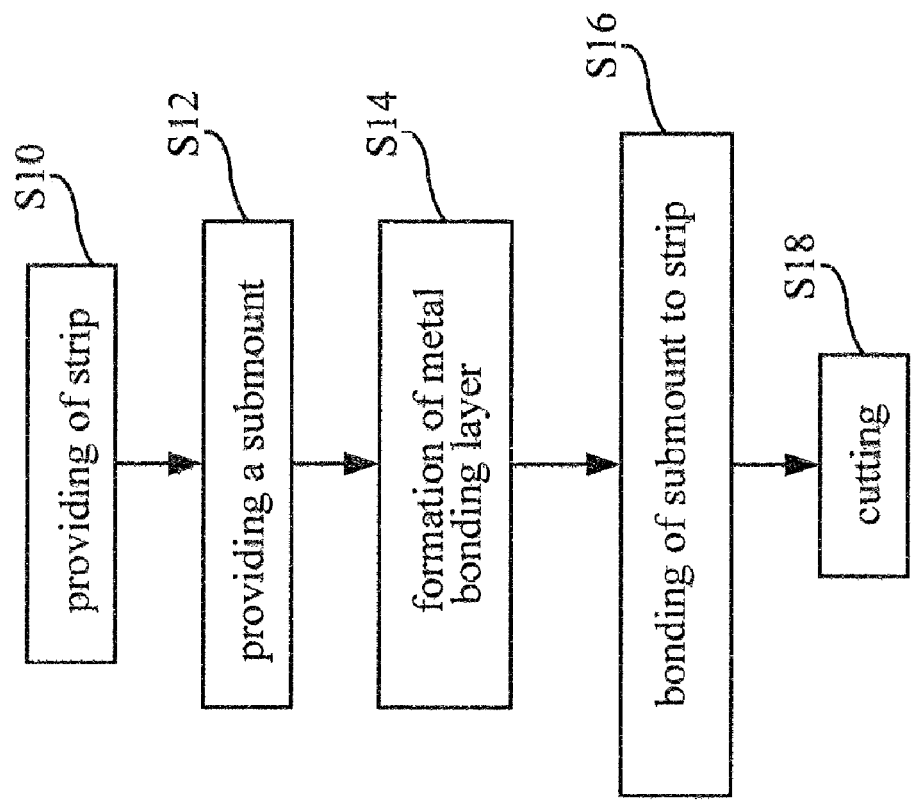
FIG. 2 is a block diagram showing the flow of a flip chip type LED lighting device manufacturing method according to the present invention.
Figure 3:
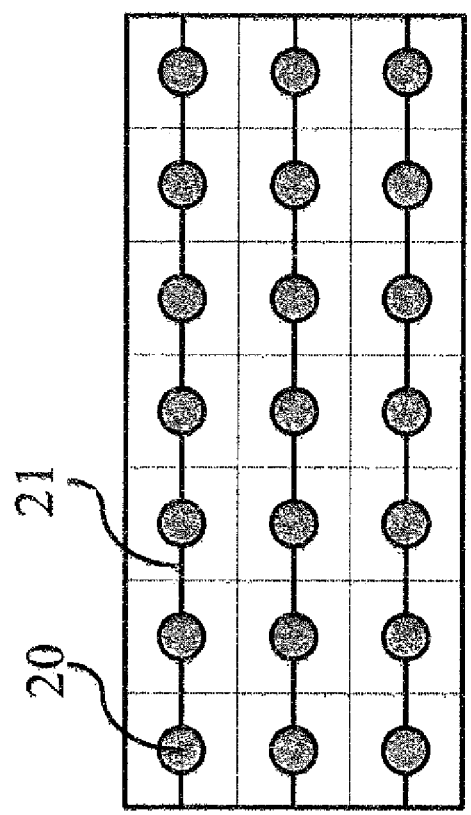
FIG. 3 is a schematic drawing of a strip for the fabrication of a flip chip type LED lighting device according to the present invention.

Referring to FIG. 2, a flip chip type LED lighting device manufacturing method in accordance with the present invention includes the steps of:

S10—providing a strip, as FIG. 3 shown, wherein the strip is prepared having a plurality of strip elements 20, each strip element 20 having a metal lead frame 21, the metal lead frames 21 of the strip elements 20 being respectively electrically connected together;

S12—providing a submount, for example, silicon or low temperature co-firing ceramic (LTCC) submount is provided, and a plurality of light emitting elements, for example, light emitting diodes are installed on the silicon submount by flip chip;

S14—formation of metal bonding layer where a metal bonding layer is formed on the bottom wall of the strip or the top wall of the submount with a low temperature solder material for example, tin base alloy, bismuth base alloy, or indium base alloy, or by means of eutectic bonding, or gold to gold ultrasonic bonding to form a lighting structure;

S16—bonding of sub-mount to strip where the submount is attached to the bottom side of the strip and at the same time the submount is heated to melt the metal bonding layer to fix the submount to the strip and to electrically connect the metal lead frames to the bond pads of the submount, or using a lower bonding temperature by associating with ultrasonic energy; and S18—cutting where the structure thus obtained is cut into individual flip chip type LED lighting devices each containing one strip element.

After the aforesaid step S18, a heat conducting/dissipating member is provided under and fixedly fastened to each individual flip chip type LED lighting device. The heat conducting/dissipating member could be bonded to the flip chip type LED lighting device by means of the application of a conductive adhesive containing silver or copper filler. Alternatively, a low temperature solder material may be directly applied on the bottom wall of the flip chip type LED lighting device and following treated with thermal process (Ex. reflow) to achieve the bonding. It is also constructive to bond a heat conducting/dissipating member to the bottom wall of each individual flip chip type LED lighting device by means of eutectic bonding.

After bonding of a heat conducting/dissipating member to the bottom wall of each individual flip chip type LED lighting device, a light condensing element, for example, condenser lens or reflector is used to adjust the light path of the lighting device, enhancing the radiation brightness.

Figure 4:
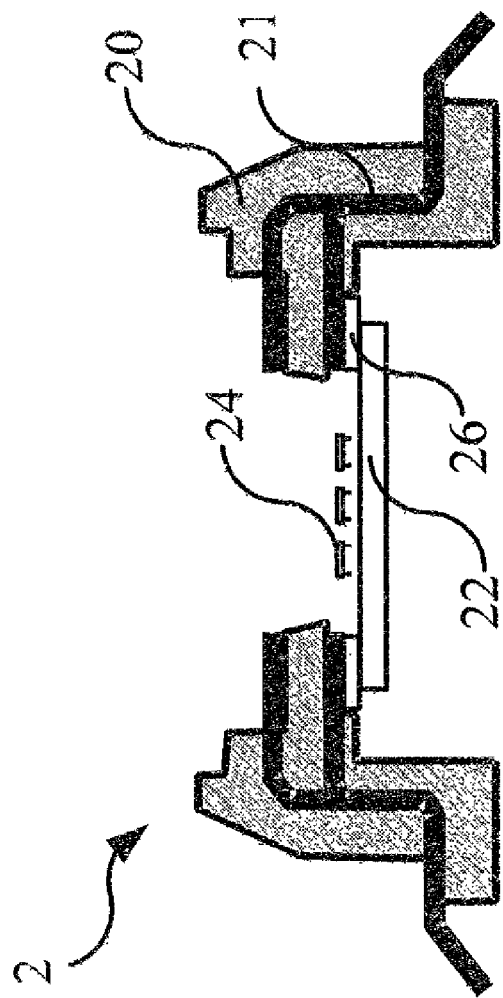
FIG. 4 is a schematic sectional view of a flip chip type LED lighting device made according to the present invention.

FIG. 4 is a sectional view of a flip chip type LED lighting device 2 made according to the present invention. As illustrated, the flip chip type LED lighting device 2 comprises a strip element 20, a metal lead frame 21 embedded in the strip element 20, a flip chip embedded submount 22 bonded to the strip element 20, flip chip LEDs 24 bonded to circuits on the strip element 20, and a metal, for example, conductive or Ag paste bonding layer 26 between the strip element 20 and the sub-mount 22.

Figure 5:
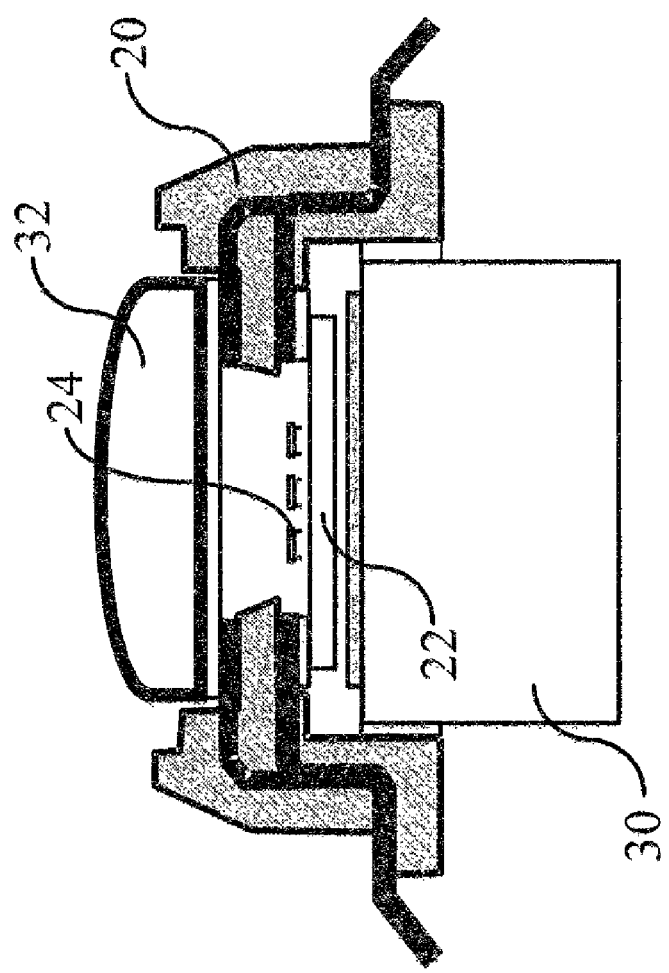
FIG. 5 is a schematic sectional view of a light module based on a flip chip type LED lighting device according to the present invention.

FIG. 5 is a light module based on the aforesaid flip chip type LED lighting device. As illustrated, the light module comprises a flip chip type LED lighting device 2, a heat conducting/dissipating member 30 bonded to the bottom wall of the submount 22 by means of a thermal interface material (TIM), for example, silver glue, copper glue, low temperature solder material, and a light condensing element 32 covering the top side of the flip chip type LED lighting device 2 to concentrate the light of the flip chip LEDs 24.

As indicated above, The method of the present invention comprises the step of providing a strip, the step of providing a submount, the step of forming a metal bonding layer on the strip or submount, the step of bonding the submount to the strip, and the step of cutting the structure thus obtained into individual flip chip type LED lighting devices. This method eliminates the is procedure of wire bonding as is commonly seen in the prior art designs. Therefore, the invention simplifies the fabrication of flip chip type LED lighting devices.

Although a particular embodiment of the invention has been described in detail for purposes of illustration, various modifications and enhancements may be made without departing from the spirit and scope of the invention.

What the invention claimed is:

1. A LED lighting device comprising:
   a submount with a plurality of light emitting diodes installed thereon;
   a strip element adhesive to the submount, wherein the strip element defines a hole therein and the area of the submount is bigger than the area of the hole of the strip element, and wherein the light emitting diodes are surrounding by the peripheral of the hole of the strip element; and
   a heat conducting member, wherein the strip element is affixed to the heat conducting member and the submount is thermally coupled to the heat conducting member;
   wherein said submount is a silicon submount having circuits arranged thereon for bonding the plurality of light emitting diodes.

2. The LED lighting device as claimed in claim 1, the plurality of light emitting diodes being electrically coupled to the strip element.

3. The LED lighting device as claimed in claim 1, wherein said heat conducting member is thermally coupled to said submount by means of a thermal interface material (TIM).

4. The lighting device as claimed in claim 1, further comprising a light condensing means bonded to the top of the strip element.

5. A LED lighting device comprising:
   a submount;
   a plurality of light emitting diodes installed on the submount;
   a strip element overlying on the submount, the strip element defining a hole therein and comprising electrical circuits, wherein the area of the submount is bigger than the area of the hole of the strip element and the light emitting diodes are surrounding by the peripheral of the hole; and
   a heat conducting member;
   wherein the strip element is affixed to the heat conducting member, and the light emitting diodes is electrically coupled to the electrical circuits of the strip element;
   wherein said submount is a silicon submount having circuits arranged thereon for bonding the plurality of light emitting diodes.

6. The LED lighting device as claimed in claim 5, the submount of the LED lighting device being thermally coupled to the heat conducting member.

7. The LED lighting device as claimed in claim 6, wherein said heat conducting member is thermally coupled to said submount by means of a thermal interface material (TIM).

8. The lighting device as claimed in claim 5, further comprising a light condensing means bonded to the top of the strip element.

* * * * *